Sept. 15, 1953 | M. L. ANTHONY ET AL | 2,652,543

ELECTROMECHANICAL FILTER

Filed June 16, 1949 | 2 Sheets-Sheet 1

INVENTORS.
Myron L. Anthony
Robert M. Virkus
BY
Foorman L. Mueller
Atty.

ELECTROMECHANICAL FILTER

Filed June 16, 1949 2 Sheets-Sheet 2

INVENTORS.
Myron L. Anthony
Robert M. Virkus
BY
Foorman L. Mueller
Atty.

Patented Sept. 15, 1953 2,652,543

UNITED STATES PATENT OFFICE 2,652,543

ELECTROMECHANICAL FILTER

Myron L. Anthony, La Grange, and Robert M. Virkus, Riverside, Ill., assignors to Motorola, Inc., Chicago, Ill., a corporation of Illinois Application June 16, 1949, Serial No. 99,496

8 Claims. (Cl. 333—71)

This invention relates to frequency selective vibrating systems and more particularly to an electromechanical filter suitable for use in radio and other electronic systems.

In the prior art, both electrical and electromechanical filter structures have been used to provide frequency selection in radio and other electronic equipment. It is desired that such filters have particular frequency characteristics to provide the required selectivity, and introduce as little distortion and loss as possible into the system. Electrical filters can be designed to provide many different characteristics but in order to provide high selectivity over relatively narrow bands, a large number of components are required and the resulting filters are large and relatively expensive. Electromechanical filters which have been previously constructed require critical components and introduce relatively large losses. Further, to provide the frequency response characteristics required, damping has been necessary in some applications to reduce undesired responses and this results in further increase in the losses. Our prior application, Serial No. 65,253, filed December 14, 1948, subject, Electromechanical Filters, describes electromechanical filter structures which provide very satisfactory characteristics. This application is directed to structures of different construction which may be preferable in certain applications.

It is, therefore, an object of the present invention to provide an improved electromechanical filter.

A further object is to provide an electromechanical filter for use in a radio receiver which provides high selectivity without introducing undesired responses.

A still further object of this invention is to provide an electromechanical filter in which the desired frequency response characteristics are provided without the use of substantial damping with the attending losses.

Still another object of this invention is to provide a supporting structure for an electromechanical filter which is simple and inexpensive and which provides adequate shielding so that coupling is not provided around the filter.

A feature of this invention is the provision of a filter including a plurality of mechanical resonant members which are coupled together and in which the Q of the members and the coupling therebetween is selected so that the overall frequency response of the filter is as desired.

A further feature of the invention is the provision of an electromechanical filter having a plurality of sections each of which has a predetermined characteristic, and means for critically coupling the sections so that the characteristics are combined to provide the desired overall characteristics.

Another feature of this invention is the provision of a supporting structure for an electromechanical filter and for the components required for coupling to the same, and which includes shields between the driving and coupling means so that direct coupling is not provided therebetween.

Further objects, features and advantages will be apparent from a consideration of the following description when taken in connection with the accompanying drawings in which.

Figure 6:
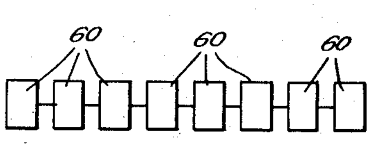
Figure 8:
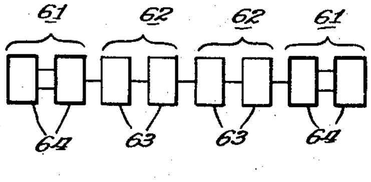
Figure 10:
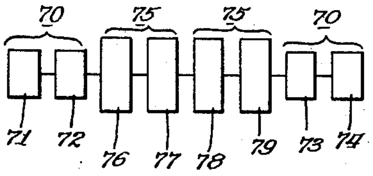

Figs. 6, 8 and 10 schematically represent various filter structures; and

Figure 7:
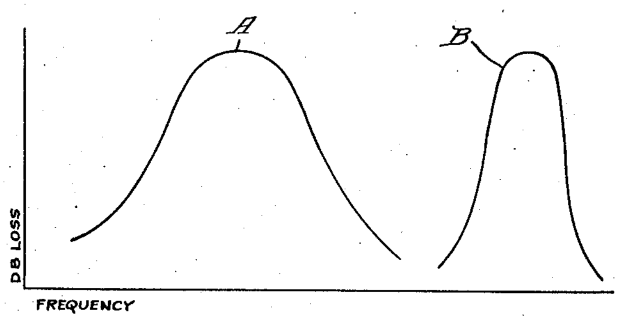
Figure 9:
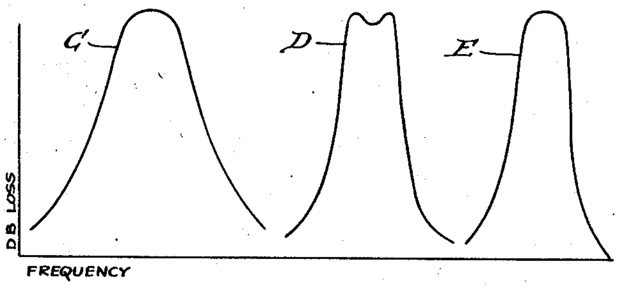
Figure 11:
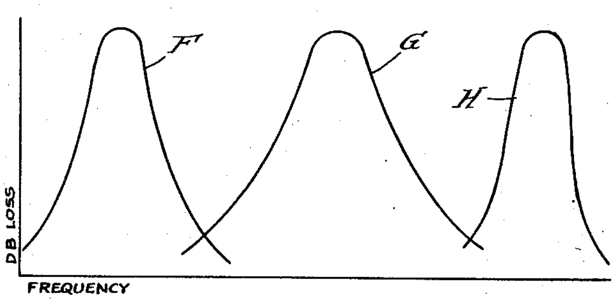

Figs. 7, 9 and 11 illustrate the response characteristics of the filter structures of Figs. 6, 8 and 10 respectively.

In practicing the invention there is provided an electromechanical filter formed of a plurality of mechanical resonant members mechanically interconnected together to provide coupling therebetween. The members may be in the form of plates of such size that the natural frequency of vibration thereof is at the frequency to be selected. The coupling may be provided by fine wires soldered to the plates. The filter may include sections made up of one or more plates with the sections having different predetermined characteristics and the various sections being critically coupled so that the responses of the various sections are combined to provide the desired overall response. The characteristics of the individual sections depend on the Q and the impedance of the plates thereof and the coupling between the plates. The filter unit is supported in a housing which may be of tubular construction and which includes end members which support matching coils for the filter. The filter itself is supported in a trough positioned intermediate the end members, with the trough being secured to the tubular housing by shielding discs which are positioned intermediate the ends of the filter. At each end of the trough, coils and magnets are supported for coupling to the end plates of the filter, with one of the coils serving to drive the filter and the other coil serving to pick up vibrations selected thereby.

Before describing the invention specifically, it is believed that a general statement as to the operation of electromechanical filters of the type disclosed will be helpful. Such filters include a plurality of vibrating members or plates which are driven at one end of the filter and from which the response is picked up at the other end. The driving of the filter, and picking up the response therefrom may be accomplished by well known magnetostrictive action. The signal to be selected is applied to a coil positioned about a magnetostrictive plate at one end of the filter and this will produce vibrations in the plate in the direction of the magnetic field. A permanent biasing field produced by a permanent magnet, for example, is also required. The frequency response of the filter depends on the dimensions of the vibratory plates. Rectangular plates are used and are arranged so that the frequency is determined by the longitudinal mode of vibration across the shorter dimension. The other dimensions do have some effect on the frequency however. The action of the mechanical filter is generally similar to that of electrical filters with the selectivity depending upon the Q of the vibrating plates. The mechanical Q of the plates therefore is a measure of the steepness of the resonance curve as in electrical filters. The resonant plates are coupled together with the amount of coupling controlled to provide the desired response as in electrical filters. That is, critical coupling may be used to increase the selectivity and to provide a rounded response, while over-coupling may be used to increase the bandwidth and provide a more flat-top response curve. The bandwidth of the filter depends upon the ratio of impedance of the coupling means to the impedance of the resonant plates, with these impedances being determined by the materials used and the cross-sectional area thereof in the direction of vibration.

Referring now to the drawings, in Figs. 1–4 the filter structure is illustrated as including a tubular housing 15 which may be of any suitable conducting material such as brass. Insulating end members 16 are provided in the ends of the tubular member with the end members including tubular inserts 17 on which matching transformers 18 are provided. Terminals 19 are provided in the end members for making connections to the matching transformers. For supporting iron cores 20 within the windings of the matching transformers, brackets 21 are provided on the end members 16 having openings in which extensions 22 from the cores are threadably received.

The filter unit itself is designated 26 and is made up of a plurality of tuned plates 33 interconnected by wires 34. The filter unit 26 is supported within the housing 15 on a channel shaped trough 23 which is supported in the housing 15 by two discs 24. A piece of resilient material 25 such as glass fabric or glass wool may be placed in the trough 23, with the filter 26 resting on the resilient material. A pad 27 of similar resilient material is placed on the filter and held in place in the channel by the spring member 28 which is held in place by turned over edges 29 of the channel 23. The bed portion of the trough, on which the filter rests, extends through narrow slots in the discs 24 at either end and supports a driving coil 30 about the vibrating plate 44 at one end of the filter unit and a response coil 31 about the vibrating plate 45 at the other end of the filter unit. The driving and response coils may be of identical construction. Permanent magnets 35 are provided adjacent the driving and pickup coils for providing a permanent magnet biasing field adjacent the driving and pickup coils. The permanent magnets 35 may be secured directly to the coils.

Figure 1:
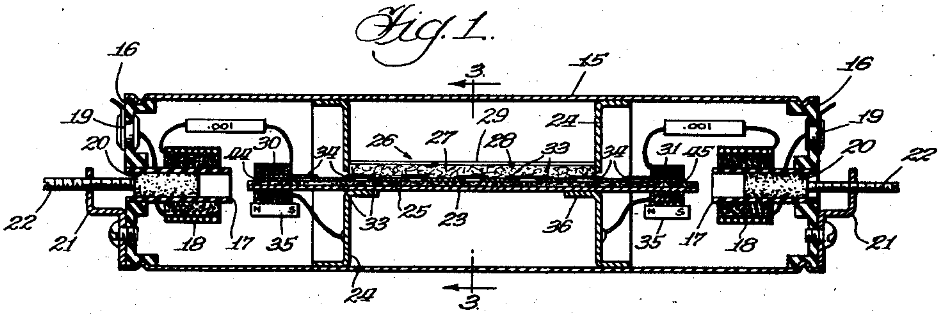
Fig. 1 is a cross-sectional view of the complete filter and coupling structure in accordance with the invention.
Figure 2:
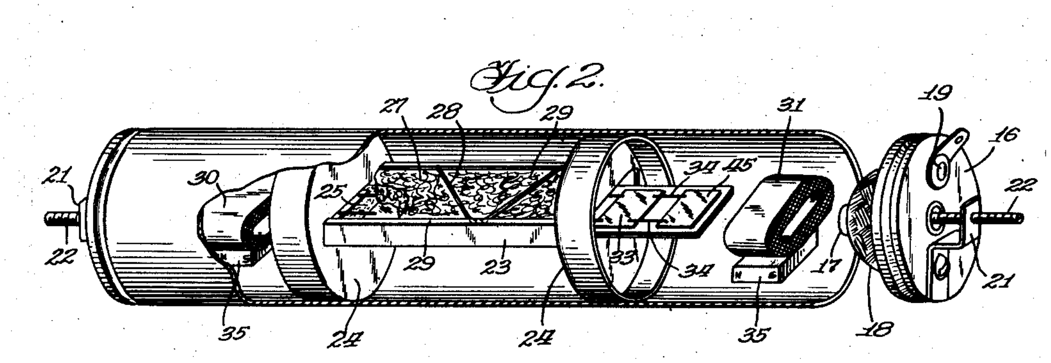
Fig. 2 is a perspective view of the filter structure with parts thereof broken away.
Figure 3:
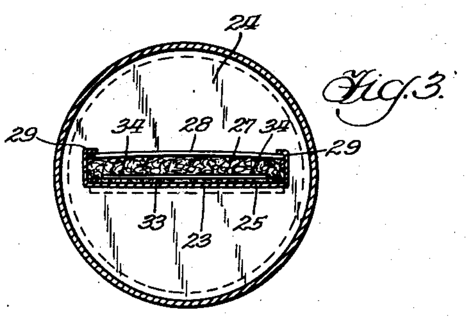
Fig. 3 is a sectional view along the lines 3—3 of Fig. 1.
Figure 4:
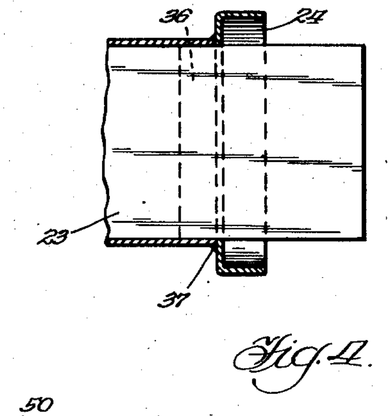
Fig. 4 is a detailed view of the filter supporting trough.

Fig. 3 is a cross-sectional view of the filter structure showing the manner in which the filter unit 26 proper is supported in the channel. The unit is lightly supported between the resilient pads 25 and 27 but is not substantially damped thereby. Fig. 4 illustrates the manner in which the channel shaped trough is secured to and supported by the shielding discs 24. The discs have portions 36 punched out to provide the openings in the discs and these portions serve as supports for the trough 23. The trough may also be soldered to the discs as indicated at 37.

Figure 5:
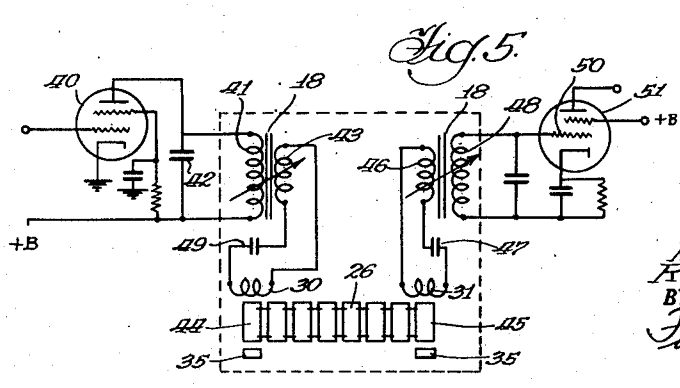
Fig. 5 is a circuit illustrating the use of a filter in an electronic circuit.

In Fig. 5 there is illustrated a circuit in which the electromechanical filter in accordance with the invention may be used. The tubes 40 and 51 may be stages of an intermediate frequency amplifier. The output of the tube 40 is applied to the tuned circuit including the primary winding 41 of the matching coil 18 and the condenser 42. This circuit may be resonated or tuned by the use of an iron core in the coil 41, for example. The secondary winding 43 is a low impedance matching winding coupling the primary winding 41 to the low impedance circuit including the driving coil 30 which is resonated by the condenser 49. The end plates 44 and 45 of the filter are made of magnetostrictive material and the alternating field of the driving coil 30 will therefore cause vibrations of the end plate 44 of filter which vibrations are transferred to the plates by the mechanical coupling therebetween. The use of a low impedance driving circuit provides increased efficiency since few turns are required in the coil and the entire field of the coil can be positioned effectively with respect to the plate 44. By use of a low inductance, the capacity required for tuning the circuit is relatively high providing better stability and better efficiency. It is to be pointed out however that a high impedance driving coil could be used which could be coupled to the tube without a matching transformer. In this case, the capacity required for tuning the circuit would be low and the stability of the circuit would be reduced.

The filter unit provides frequency selection and the frequencies transmitted by the filter unit produce a voltage in the response coil 31 which is positioned around the end plate 45 at the other end of the filter. This response coil is resonated by condenser 47 and connected to the low impedance primary winding 46 of the second matching coil 18. The frequencies selected are transferred from the primary winding 46 to the high impedance secondary winding 48 of the transformer and are then applied to the grid 50 of the tube 51 wherein the selected signal may be amplified.

Reference is now made to Figs. 6–11 inclusive which illustrate operating characteristics of filter units of various constructions. In Fig. 6 there is illustrated a filter unit made up of a plurality of substantially identical resonant plates which have relatively low Q. That is, these plates are all made of the same material and have exactly the same dimensions so that the natural frequency of vibration, the impedance and the Q are all the same within relatively small tolerances. The response characteristic of each plate is represented by the curve A of Fig. 7. The plates are critically coupled together so that the responses of the individual plates are additive to provide an overall response such as illustrated in curve B of Fig. 7. It is to be noted that the curves A and B of Fig. 7 do not have response characteristics with a square top and sharp corners but have a rounded top. Such band pass characteristics are desired to provide selectivity without undesired transient responses as will be more fully explained. To provide curves of this shape the Q of the sections of the filter should be of the order of 75 for a band width of about 20 kilocycles. The selectivity varies directly with the Q and the band width varies inversely with the Q which provides the same shape response curve. When the Q is lower than the optimum value, decreased selectivity will result, and when the Q is higher, although increased selectivity is provided, undesired transients will be produced by impulse noise in the receiver which are objectionable and may produce completely intolerable conditions.

Fig. 8 illustrates a modified filter construction which includes a plurality of sections which are of different construction. These sections include the sections 61 at the ends of the filter and the intermediate sections 62. The intermediate sections are composed of plates 63 which may be plates similar to the plates 60 of Fig. 6 which are of relatively low Q and which are critically coupled together in pairs to provide a combined response as indicated in curve C of Fig. 9. The end sections 61 include plates 64 which are of high Q and may be overcoupled so that the overall response is double-humped as illustrated by curve D of Fig. 9. The frequency and band pass characteristics of the various plates must be selected so that the band pass of curve C and D and the center frequency of these curves are the same. The sections 61 and 62 are then critically coupled together to provide the overall response illustrated by curve E.

In Fig. 10 a different construction is illustrated in which the filter unit is also formed of a plurality of sections having different characteristics. The sections 70, made up of plates 71 and 72, and 73 and 74, may include plates which are generally similar to the plates 60 of Fig. 6. This filter also includes sections 75 made up of plates having the same Q but having a larger cross-sectional area so that the impedance thereof is increased. These sections include plates 76 and 77, and 78 and 79. The increased impedance of the plates results in a reduction in the band widths of these sections with the response characteristic of the sections 75 being illustrated by curve F of Fig. 11 and the response characteristics of the sections 70 being illustrated by the curve G. The sections 70 and 75 are then critically coupled together so that the separate characteristics are combined. The curve H shows the overall response characteristic of this filter.

As explained in our previous application referred to above, a filter having a response characteristic with sharp corners is not actually desirable. Even when high selectivity is required such a response characteristic is characterized by large transient responses or ringing produced by impulse noises. Although mechanical filters can be shaped to eliminate the transients by damping, this results in large losses and this is obviously not desirable. It has been found that when the phase shift of the frequencies across the band of the filter is linear with frequency, the ringing response is a minimum. This requirement may be met by proper selection of the Q of the plates and the coupling between the plates. It has been found that the band pass characteristics will have a rounded top or rounded corners when this specified phase shift relation is met. Filters having band pass characteristics with steep sides and sharp corners cannot have this desired relation. Steep sides, resulting in high selectivity, can, however, be provided by the use of a larger number of critically coupled plates, and such a structure will have the phase relation which provides minimum ringing.

As the plates are driven, and the energy picked up therefrom by magnetostrictive action, it is desired that plates be used having as high a magnetostrictive coefficient as possible. Various alloys, such as nickel alloys, are available which provide the desired magnetostrictive properties. In order to obtain materials having a high magnetostrictive coefficient, it may be necessary to use materials having higher Q than would be desirable. However, it is only necessary that the end plates have a high magnetostrictive coefficient and therefore only the end plates need be of higher Q. In the modification of Fig. 8, the end plates are of higher Q than the intermediate plates. In modification shown in Fig. 6, satisfactory operation is obtained by using plates having somewhat higher Q at the ends and reducing the coupling so that the plates are still critically coupled. In some applications it may be possible to use plates of higher Q without changing the coupling and still produce satisfactory results. In order to make the plates uniform, all the plates and the filters may be made of such magnetostrictive material. This facilitates manufacture of plates which have identical characteristics. The use of magnetostrictive plates throughout also facilitates calibration of the plates as the plates can be driven magnetostrictively in testing to determine their resonant frequency. It is also desired that the plates have a substantially zero frequency-temperature characteristic. Otherwise change in temperature would produce a change in the resonant frequency of the plates and change in the frequency response of the filter.

It is to be noted that all of the plates of the filter may be identical and terminating half impedance sections are not required as in usual filters. This is because each section operates as a resonant system and the various systems are critically coupled so that the responses thereof are additive. In these filters any intermediate plate can be driven and vibrations picked up from any plate without changing the basic operation of the system. Of course, the degree of selectivity depends upon the number of sections used but it is not necessary to provide special terminating end sections which are different than intermediate sections as in prior electromechanical filter structures.

The overall frequency response characteristics of the filter can be shaped or tailored by various means such as the use of sections having different characteristics. In some cases the desired response may be obtained by having all the plates identical and all critically coupled to each other so that the characteristics are simply additive to provide the desired frequency selectivity. However, the various sections may be made of plates having different impedances and/or different Q's and the plates in each section may have various degrees of coupling. In providing such sections having different response characteristics, and critically coupling the sections together, a different response characteristic, as desired, may be obtained. It is to be pointed out that the center frequency of all the different sections should be the same in order to provide a response characteristic as is usually required.

Various changes can be made in the particular configuration of the plates and in the coupling means, and sections of different types may be combined to provide the desired overall response. Certain embodiments of the invention have been specifically disclosed but it is not desired to limit the invention to these embodiments as various changes and modifications can obviously be made within the principals set forth herein. The invention is intended to cover all such modifications which come within the scope of the appended claims.

We claim:

1. An electromechanical filter comprising a plurality of resonant systems including flat rectangular resonant members, each of said members being substantially identical as to natural frequency of vibration, impedance, and Q, means secured to the edges of said members for mechanically interconnecting said members together to form a series of resonant systems, said means providing critical coupling between adjacent resonant systems so that the overall response of said filter is maximum at a frequency substantially the same as said natural frequency of said systems, means for initiating vibrations in the member at one end of said series, and means for picking up the vibrations from the member at the other end of said series.

2. An electromechanical filter comprising a plurality of resonant systems all of which have the same center resonant frequency, each of said systems including at least one mechanical resonant member in the form of a flat rectangular plate, and mechanical means secured to the edges of said plates interconnecting said systems, said mechanical means providing critical coupling between each of said systems so that the overall response of said filter is maximum at said center frequency.

3. An electromechanical filter comprising a plurality of resonant systems all of which have the same center resonant frequency, each of said systems including at least two identical mechanical resonant members in the form of flat rectangular plates, and mechanical means secured to the edges of said plates interconnecting said systems, said mechanical means providing critical coupling so that the overall response of said filter is maximum at said center frequency.

4. An electromechanical filter comprising a plurality of resonant members forming first and second separate groups, said members of each group being identical as to natural frequency of vibration, impedance and Q, said members of said first group having higher Q than said members of said second group, first mechanical means for interconnecting said members of said first group together in pairs and providing over coupling thereof, second mechanical means for interconnecting said members of said second group together in pairs and providing critical coupling thereof, said natural frequency of said members of said groups being so related that said pairs of low Q members have an overall response which is maximum at the natural frequency of said members of said second group, and said pairs of high Q members have an overall response which is maximum at frequencies substantially equally spaced from said natural frequency of said members of said second group, and means providing critical coupling between said pairs of members so that the overall response of said filter structure is maximum at said natural frequency of said members of said second group.

5. An electromechanical filter comprising first and second pairs of mechanical resonant members, said members of each pair being identical as to natural frequency of vibration, impedance and Q, first mechanical means for interconnecting said first pair of members and providing over coupling thereof, second mechanical means for interconnecting said second pair of members and providing critical coupling thereof, said natural frequency of said members and said Q thereof being so related that the overall response of both pairs have substantially the same band width and center frequency, and means providing critical coupling between said pairs of members.

6. An electromechanical filter structure comprising an elongated filter unit made up of a plurality of mechanically interconnecting vibrating members in the form of flat plates, a conducting housing, means supporting said filter unit within said housing, a driving coil associated with the member at one end of said filter unit, a pickup coil associated with the member at the end of said filter unit opposite to said one end, said driving coil and said pickup coil being mounted on said supporting means, end members for said housing for substantially closing the same, and matching coils supported on said end members within said housing for coupling to said driving and pickup coils, said supporting means forming a shield for eliminating the effect of the field of said driving coil and its associated matching coil on said pickup coil and its associated matching coil.

7. An electromechanical filter structure comprising an elongated filter unit formed of a plurality of mechanically interconnected resonant magnetostrictive plates, a tubular housing for said filter unit, a flat trough within said housing for supporting said filter unit, shielding discs positioned intermediate the ends of said trough for supporting said trough from said housing, a driving coil for said filter unit supported on said trough at one end thereof, a pickup coil supported on said trough at the other end thereof, and end members secured to said housing including terminals for making connections with said driving and pickup coils, and arranged to complete the enclosure of said trough and said driving and pick-up coils.

8. An electromechanical filter structure including a plurality of mechanical resonant systems all of which have the same center frequency, said systems being divided into first and second groups, with the systems of said first group having a first predetermined impedance and the systems of said second group having a second predetermined impedance greater than said first predetermined impedance, mechanical coupling means for interconnecting said systems, said coupling means providing critical coupling so that the over-all response of said filter is maximum at the center frequency of said systems, said systems of said second group providing narrower bandwidths than said systems of said first group so that the band-pass response of said complete filter has gradually sloping sides.

MYRON L. ANTHONY.
ROBERT M. VIRKUS.

References Cited in the file of this patent

UNITED STATES PATENTS

| Number | Name | Date |
|---|---|---|
| 1,654,123 | Hartley | Dec. 27, 1927 |
| 1,666,681 | Burgess | Apr. 17, 1928 |
| 1,784,830 | Flanders | Dec. 16, 1930 |
| 1,938,620 | Braden | Dec. 12, 1933 |
| 1,997,599 | Pierce | Apr. 16, 1935 |
| 2,091,250 | Blackman | Aug. 31, 1937 |
| 2,283,924 | Harvey | May 26, 1942 |
| 2,501,488 | Adler | Mar. 21, 1950 |